(12) United States Patent
Uckert et al.

(10) Patent No.: US 7,049,392 B2
(45) Date of Patent: May 23, 2006

(54) ELECTROLUMINESCENT COPOLYMERS WITH MULTI-FUNCTIONAL MONOMERS AND METHODS FOR USE THEREOF

(75) Inventors: Frank P. Uckert, Santa Barbara, CA (US); Howard E. Simmons, III, Wilmington, DE (US)

(73) Assignee: E. I. du Pont de Nemour and Company, Wilmington, DE (US)

( * ) Notice: Subject to any disclaimer, the term of this patent is extended or adjusted under 35 U.S.C. 154(b) by 0 days.

(21) Appl. No.: 10/771,045

(22) Filed: Feb. 3, 2004

(65) Prior Publication Data

US 2004/0204557 A1    Oct. 14, 2004

Related U.S. Application Data

(60) Provisional application No. 60/446,900, filed on Feb. 12, 2003.

(51) Int. Cl.
*C08G 73/00* (2006.01)
*C08F 283/00* (2006.01)

(52) U.S. Cl. ............ 528/422; 528/397; 525/242; 525/540; 428/690; 428/917

(58) Field of Classification Search ........ 525/242, 525/244, 330.9, 540; 428/690, 917; 427/372.2, 427/384; 528/422, 397
See application file for complete search history.

(56) References Cited

U.S. PATENT DOCUMENTS

| | | |
|---|---|---|
| 4,508,639 A | 4/1985 | Camps et al. |
| 5,621,131 A | 4/1997 | Kreuder et al. |
| 5,708,130 A | 1/1998 | Woo et al. |
| 5,777,070 A | 7/1998 | Inbasekaran et al. |
| 5,814,244 A | 9/1998 | Kreuder et al. |
| 5,821,002 A | 10/1998 | Ohnishi et al. |
| 5,856,434 A | 1/1999 | Stern et al. |
| 5,900,327 A | 5/1999 | Pei et al. |
| 5,962,631 A | 10/1999 | Woo et al. |
| 5,998,045 A | 12/1999 | Chen et al. |
| 6,107,452 A | 8/2000 | Miller et al. |
| 6,169,163 B1 | 1/2001 | Woo et al. |
| 6,204,515 B1 | 3/2001 | Bernius et al. |
| 6,255,449 B1 | 7/2001 | Woo et al. |

(Continued)

FOREIGN PATENT DOCUMENTS

EP    0 259 229 B1    9/1987

(Continued)

OTHER PUBLICATIONS

Sander, R. et al., Synthesis, Properties, and Guest-Host Systems of Triphenylamine-Based Oligo(arylenevinylene)s: Advanced Materials for LED Applications, Macromolecules, 1996, 7705-7708, 29, American Chemical Society.

(Continued)

*Primary Examiner*—Duc Truong

(57) ABSTRACT

Polymeric compositions are provided comprising a first plurality of first monomeric units comprising an aromatic group with at least one substituent selected from alkyl, heteroalkyl, alkenyl, heteroalkenyl, alkynyl, heteroalkynyl, aryl, arylalkyl, heteroaryl, heteroarylalkyl, and amino, and a second plurality of second multi-functional monomeric units, wherein each multi-functional monomeric unit is capable of forming a branching point in the polymeric composition, thereby resulting in a branched material. Invention compositions therefore have an altered morphology relative to similar non-branched materials. When used to form an EL layer within an EL device, this altered morphology results in EL layers with improved efficiency, which in turn results in more efficient EL devices.

12 Claims, 1 Drawing Sheet

U.S. PATENT DOCUMENTS

| | | |
|---|---|---|
| 6,309,763 B1 | 10/2001 | Woo et al. |
| 6,541,602 B1 | 4/2003 | Spreitzer et al. |
| 6,605,373 B1 | 8/2003 | Woo et al. |
| 6,653,438 B1 | 11/2003 | Spreitzer et al. |
| 2002/0013451 A1 | 1/2002 | Huang et al. |
| 2002/0051895 A1 | 5/2002 | Cho et al. |

FOREIGN PATENT DOCUMENTS

| | | |
|---|---|---|
| EP | 0 956 312 B1 | 1/1998 |
| EP | 0 964 045 A1 | 12/1999 |
| EP | 1 138 746 A1 | 10/2001 |
| EP | 1 213 336 A2 | 6/2002 |
| EP | 1 281 745 A1 | 2/2003 |
| EP | 1 205 526 B1 | 9/2004 |
| WO | WO 99/54943 A1 | 10/1999 |
| WO | WO 00/53656 A1 | 9/2000 |
| WO | WO 00/55927 A1 | 9/2000 |
| WO | WO 01/07502 A2 | 2/2001 |
| WO | WO 02/092724 | 11/2002 |

OTHER PUBLICATIONS

Gamerith, S. et al., Comparison of thermal and electrical degradation effects in polyfluorenes, Synthetic Metals, 2003, 855-858, 139, Elsevier B.V.

DE 19846767, Partially conjugated polymer useful as an organic semiconductor.or an electroluminescence material, and for display elements in television monitor and illumination technology contains fluorene building units, Abstract, Jun.13, 2000, Aventis Res & Technologies Gmbh.

JP 2000319272, (Diarylamino) furan analogues with improved stability, useful pharmaceutical intermediates and electron hole transport or photosensitive materials, Abstract, Apr. 21, 2001, Tosoh Corp.

JP 08157575, Carrier transport polymers—useful as carrier transport materials in organic thin film electroluminescence devices, Abstract, Oct. 25, 1996, Toppan Printing Co. Ltd.

JP 2000143778, Display element such as cathode ray tube and light emitting diode, comprises specified light emitting compound as color developing materials, Abstract. Oct. 6, 2000, Samsung Denkan KK.

JP 10273522, Production of phenylene group-containing copolymers—comprises copolymerizing phenylene group-containing compounds in presence of catalysts containing transition metal compounds, Abstract, Jan. 13, 1999, Nippon Gosei Gomu KK.

JP 10273521, Production of phenylene group-containing copolymers—comprises copolymerizing phenylene group-containing compounds in presence of catalysts containing transition metal compounds, Abstract, Dec. 23, 1999, Nippon Gosei Gomu KK.

JP 03028220, Electrochromic elements for display or optical shield glass—contg. film of polyphenylene polymer derived from fluorene, Abstract, Sep. 28, 1993, Idemitsu Kosan Co. Ltd.

JP 03017120, Polyphenylene polymers used as conductive material or display material are produced by chemical or electrochemical-oxidative polymerizing of specified fluorene derivs, Abstract, Sep. 28, 1993, Idemitsu Kosan Co. Ltd.

JP 02269734, New polyphenylene-type polymer prepd. By oxidn. Polymerization of fluroene derive., Abstract, Sep. 28, 1993, Idemitsu Kosan Co. Ltd.

KR 99057430, Fluorene-based alternating statistical copolymer containing multi-luminescence groups and electroluminescence device using the same, Abstract, Jul. 15, 1999, Korea Adv Inst Sci & Technology.

Cowell, Allan B. et al., Fluoroalkylation of Aromatic Compounds, Journal of Fluorine Chemistry, 17, 1981, 345-356, Elsevier Sequoia S.A., Lausanne, The Netherlands.

Kamigata, Nobumasa et al., Direct Perfluoroalkylation of Aromatic and Heteroaromatic Compounds with Perfluoroalkanesulfonyl Chlorides Catalysed by a Ruthenium (II) Phosphine Complex, J. Chem. Soc.Perkin Trans., 1, 1994, 1339-1346.

Klarner, G. et al., Cross-linkable Polymers Based on Dialkylfluorenes, Chem. Mater., 1999, 1800-1805, 11, American Chemical Society.

Chen, J.P. et al., Efficient, blue light-emitting diodes using cross-linked layers of polymeric arylamine and fluorene, Synthetic Metals, 1999, 129-135, 107, Elsevier Science S.A.

Scott, J. C. et al., Full Visible Spectrum From Multilayer Polyfluorene Light-Emitting Diodes, Abstract Submitted for the MAR00 Meeting of The American Physical Society, Mar. 21, 2000.

Chen, J.P. et al., Efficient, Blue Light-Emitting Diodes Using Crosslinked Polymer Multilayers, Polymer Preprints, 1999, 1232-1233, 40, American Chemical Society.

ELECTROLUMINESCENT COPOLYMERS WITH MULTI-FUNCTIONAL MONOMERS AND METHODS FOR USE THEREOF

This application claims priority to provisional application Ser. No. 60/446,900, dated Feb. 12, 2003.

BACKGROUND OF THE INVENTION

1. Field of the Invention

This invention relates to electroluminescent copolymers with multi-functional monomers. The invention further relates to electronic devices in which an active layer includes such polymeric materials.

2. Description of the Related Art

Electroluminescent (EL) devices (such as light-emitting diodes) are present in many different kinds of electronic equipment. In all such devices, an electroluminescent layer is sandwiched between two electrical contact layers. At least one of the electrical contact layers is light-transmitting so that light can pass through the electrical contact layer. The electroluminescent layer emits light through the light-transmitting electrical contact layer upon application of electricity across the electrical contact layers.

Several classes of photoluminescent polymers have been used as electroluminescent layers, including poly(1,4-phenylene vinylene) and derivatives; polythiophenes, especially, poly(3-alkylthiophenes); poly(p-phenylenes), and alkyl and dialkyl derivatives of polyfluorene. Although these materials are suitable for use as electroluminescent layers, there is an increasing demand for EL devices with improved efficiency and increased operational lifetime. Accordingly, there is a concomitant need for materials which can impart improved efficiency to an EL device.

SUMMARY OF THE INVENTION

Polymeric compositions are provided comprising a first plurality of first monomeric units comprising an aromatic group with at least one substituent selected from alkyl, heteroalkyl, alkenyl, heteroalkenyl, alkynyl, heteroalkynyl, aryl, arylalkyl, heteroaryl, heteroarylalkyl, and amino, and a second plurality of second multi-functional monomeric units, wherein each multi-functional monomeric unit is capable of forming a branching point in the polymeric composition, thereby resulting in a branched material. Invention compositions therefore have an altered morphology relative to similar non-branched materials. When used to form an EL layer within an EL device, this altered morphology results in EL layers with improved efficiency, which in turn results in more efficient EL devices.

In another embodiment, there are provided organic light emitting diodes and electroluminescent devices including active layers comprising invention compositions.

In another embodiment, there are provided methods for improving the efficiency of an electroluminescent device having at least one active layer comprising aromatic polymer, the method comprising incorporating into the aromatic polymer a plurality of multi-functional monomeric units that form branching points in the aromatic polymer, thereby improving efficiency of the electroluminescent device.

DETAILED DESCRIPTION OF THE INVENTION

Figure 1:
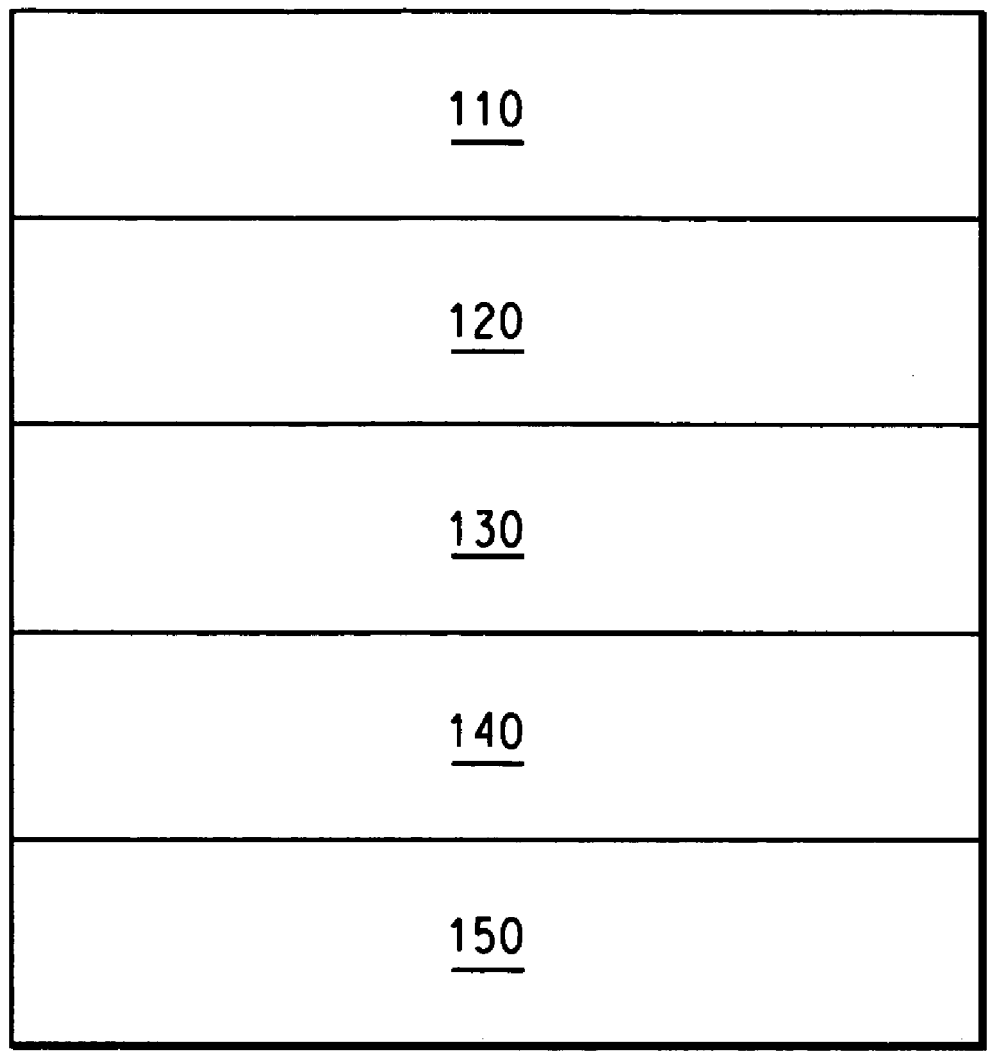
FIG. 1 illustrates a cross-sectional view of an electronic device that includes an active layer comprising a polymeric composition according to the invention.

Invention compositions are polymers which comprise a first plurality of first monomeric units comprising an aromatic group with at least one substituent selected from alkyl, heteroalkyl, alkenyl, heteroalkenyl, alkynyl, heteroalkynyl, aryl, arylalkyl, heteroaryl, heteroarylalkyl, and amino, and a second plurality of second multi-functional monomeric units, wherein each multi-functional monomeric unit is capable of forming a branching point in the polymeric composition. As used herein, a "monomer" is a molecule capable of reacting with other monomers to form a polymer. A "monomeric unit" is the repeating unit in a polymer which results from the polymerization of the monomer. A "multi-functional monomer" is a monomer having more than two polymerizable functional groups, so that it is capable of covalently bonding to more than two other monomers in polymerization. As such, the multi-functional monomeric unit can create a branched polymeric composition.

As used herein, the term "branched", when used to describe a polymeric composition, refers to a composition wherein the main polymer chains contain a branching point wherever a multi-functional monomeric unit is incorporated. In addition, it is understood that the term "branched" can refer to a polymeric composition having a branch propagating from a branch. Finally, "branched" may also refer to a situation where a branch propagating from a first main polymer chain may bond to a branching point of a second polymer chain, resulting in a "crosslink" between the two main polymer chains. As used herein, the term "main polymer chain" is intended to mean the portion of the polymer having the longest portion of contiguous monomeric units.

The first monomeric unit comprises an aromatic group with at least one substituent selected from alkyl, heteroalkyl, alkenyl, heteroalkenyl, alkynyl, heteroalkynyl, aryl, arylalkyl, heteroaryl, heteroarylalkyl, and amino. As used herein the term "amino" is intended to mean NR', where R' is H or an alkyl. Examples of suitable aromatic groups include mono- and polycyclic aromatic hydrocarbons, such as fluorenes, spirofluorenes, phenyls, biphenyls, bridged biphenyls, naphthalenes, anthracenes, and the like. The aromatic group can be substituted at one or more positions, preferably two positions. The substituents are preferably alkyl groups having from 1 to 20 carbon atoms. Preferred first monomeric units contemplated for use in the practice of the invention include fluorenes having the structure:

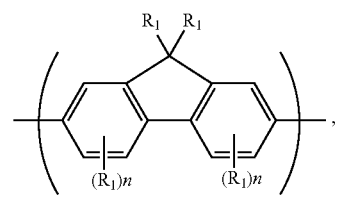

wherein:

$R_1$ can be the same or different at each occurrence and is selected from hydrogen, alkyl, heteroalkyl, alkenyl, heteroalkenyl, alkynyl, heteroalkynyl, aryl, arylalkyl, heteroaryl, heteroarylalkyl, and amino; and n is a number of potential sites in a corresponding aromatic group capable of substitution by $R_1$.

Particularly preferred are the dialkyl fluorenes, having two alkyl groups at the 9-position.

Alternatively, the first monomeric unit may also be selected from a combination of the above aromatic groups connected by a single bond, ethenyl or ethynl group.

The term "alkyl" is intended to mean a group derived from an aliphatic hydrocarbon and includes linear, branched and cyclic groups which may be unsubstituted or substituted. The term "heteroalkyl" in intended to mean an alkyl group, wherein one or more of the carbon atoms within the alkyl group has been replaced by another atom, such as nitrogen, oxygen, sulfur, and the like.

The term "alkenyl" is intended to mean a group derived from an aliphatic hydrocarbon having at least one carbon-carbon double bond, and includes linear, branched and cyclic groups which may be unsubstituted or substituted. The term "heteroalkenyl" is intended to mean an alkenyl group, wherein one or more of the carbon atoms within the alkenyl group has been replaced by another atom, such as nitrogen, oxygen, sulfur, and the like.

The term "alkynyl" is intended to mean a group derived from an aliphatic hydrocarbon having at least one carbon-carbon triple bond, and includes linear, branched and cyclic groups which may be unsubstituted or substituted. The term "heteroalkenyl" is intended to mean an alkynyl group, wherein one or more of the carbon atoms within the alkynyl group has been replaced by another atom, such as nitrogen, oxygen, sulfur, and the like.

The term "aryl" is intended to mean a group derived from an aromatic hydrocarbon which may be unsubstituted or substituted. The term "heteroaryl" in intended to mean an aryl group, wherein one or more of the carbon atoms within the aryl group has been replaced by another atom, such as nitrogen, oxygen, sulfur, and the like.

The term "arylalkyl" is intended to mean a group derived from an alkyl group having an aryl substituent. The point of attachment is on the aryl part of the group. The term "heteroarylalkyl" is intended to mean a group derived from an alkyl group having a hetaryl substituent. The point of attachment is on the heteroaryl part of the group.

As used herein, the term "spirofluorene" is intended to mean two fluorene groups attached at the 9-position. The term "9-position" refers to the carbon in fluorene given the number designation 9, according to IUPAC nomenclature.

The second monomeric unit is a second aromatic or heteroaromatic group having more than two possible points of attachment to the polymer. It is preferred to have three or four points of attachment. Suitable second aromatic groups include groups with one or more benzene rings and triaryl amines. Examples of suitable second monomeric units include: $RC(C_6H_5)_3$, where R is H or alkyl,

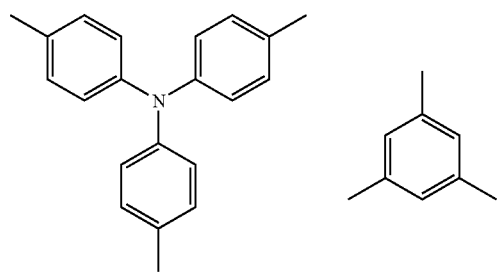

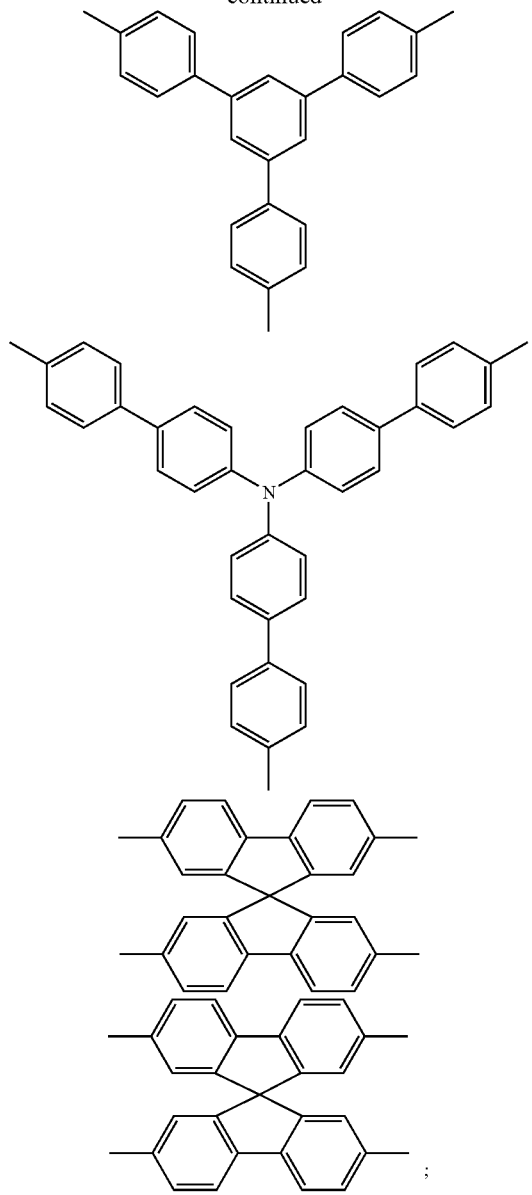

These groups can be unsubstituted or substituted with alkyl groups from 1–20 carbon atoms or aryl groups from 3–20 carbon atoms.

The multi-functional monomeric unit typically comprises from 0.1 mol % to about 5.0 mol % of the total polymeric composition; preferably 0.1 to 2.0 mol %. The degree of polymerization of the polymer is at least 10; preferably greater than 50; more preferably greater than 100. The term "degree of polymerization" is intended to mean the total number of monomeric units in the polymer.

The polymeric composition of the invention may additionally comprise other monomeric units. These units may be added to alter the electronic properties of the polymer, such as charge transport or emission color; to alter the physical properties of the polymer, such as solubility; or to enhance or alter other properties of the polymer.

Invention polymeric compositions can be prepared by a variety of conventional techniques. Both Yamamoto and Suzuki polymerization can be used. In Yamamoto polymerization, monomers having Cl, Br, I, or toslyate functional groups, are added to a solution of a Ni(0) compound in an inert solvent. Typically, a nickel (0) cyclooctadiene complex is used in the presence of a 2,2'-bipyridine in a solvent such as DMF. The reaction is generally carried out at temperatures in the range of 60–80° C., and the resulting polymers isolated using known techniques, such as precipitation.

In Suzuki polymerization, monomers having boronic acid functional groups are polymerized with monomers having halide or tosylate functional groups in coupling reactions using Pd(0) catalysts. Alternatively, monomers having both types of functional groups can be used. The monomers may be commercially available, or can be prepared using known synthetic procedures. For example, monomers having two or more bromine groups can be synthesized by bromination of an aromatic compound in chloroform. Di- or multi-boronic acids can be synthesized, for example, by reacting a di- or multi-bromo-aromatic compound with an organolithium reagent, then quenching the reaction with trimethylborate.

The use of a multi-functional monomeric unit results in branched polymeric materials, as illustrated below (for exemplary purposes only) in the copolymerization of a 2,7-dibromo-9,9-dialkyl-fluorene with a tri-functional monomer, tris(4-bromophenyl)amine:

During the copolymerization, the random insertion of a multi-functional monomer into a polyfluorene chain creates a branching point, where a polyfluorene branch can propagate. In addition, a multi-functional monomer can be inserted into a growing branch, which creates a branch propagating from a branch. Accordingly, the copolymerization of a multi-functional monomer with, e.g., fluorene, provides a "highly branched" material resulting in an altered morphology compared to un-branched polyfluorene. Because the multi-functional monomeric unit is present in a relatively low concentration in the polymer, it does not alter the electronic levels (HOMO and LUMO) of the polymer, as shown by cyclic voltammetry data. However, when the copolymer of the invention is incorporated into an electroluminescent device as an active layer, the altered morphology results in improved device efficiencies. As used herein, the term "active" refers to any material that exhibits electroluminescence or other electro-radiative properties.

Although crosslinking between main polymer chains can occur when polymerizing invention polymeric compositions, it is understood that the degree of crosslinking is low. Accordingly, invention compositions are soluble in common processing solvents. Thus, invention compositions can be incorporated into electroluminescent devices by solution techniques, such as spin coating.

In another embodiment of the invention, there are provided electronic devices comprising at least one electroactive layer positioned between two electrical contact layers, wherein at least one of the layers of the device includes an electroluminescent layer comprising invention compositions. As shown in FIG. 1, a typical device has an anode layer 110, a buffer layer 120, an electroluminescent layer 130, and a cathode layer 150. Adjacent to the cathode layer

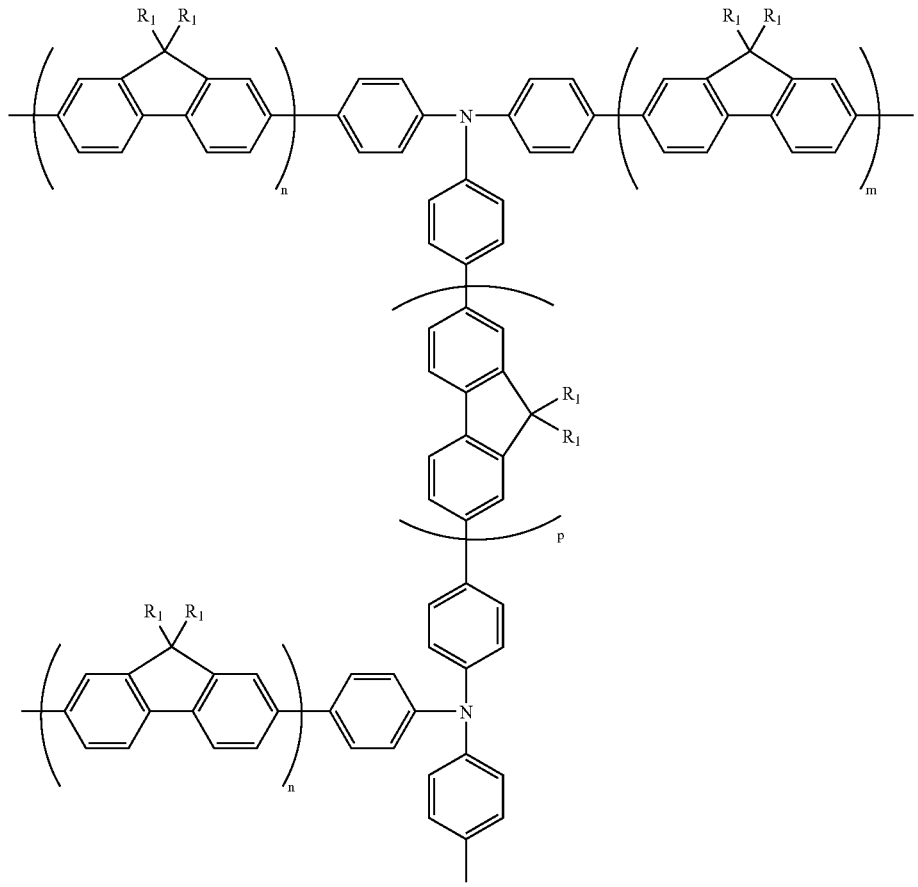

150 is an optional electron-injection/transport layer 140. Between the buffer layer 120 and the cathode layer 150 (or optional electron injection/transport layer 140) is the electroluminescent layer 130.

The device may include a support or substrate (not shown) that can be adjacent to the anode layer 110 or the cathode layer 150. Most frequently, the support is adjacent the anode layer 110. The support can be flexible or rigid, organic or inorganic. Generally, glass or flexible organic films are used as a support. The anode layer 110 is an electrode that is more efficient for injecting holes compared to the cathode layer 150. The anode can include materials containing a metal, mixed metal, alloy, metal oxide or mixed oxide. Suitable materials include the mixed oxides of the Group 2 elements (i.e., Be, Mg, Ca, Sr, Ba, Ra), the Group 11 elements, the elements in Groups 4, 5, and 6, and the Group 8–10 transition elements. As used herein, group numbers corresponding to columns within the periodic table of the elements use the "New Notation" convention as seen in the *CRC Handbook of Chemistry and Physics*, $81^{st}$ Edition (2000–2001). If the anode layer 110 is to be light transmitting, mixed oxides of Groups 12, 13 and 14 elements, such as indium-tin-oxide, may be used. As used herein, the phrase "mixed oxide" refers to oxides having two or more different cations selected from the Group 2 elements or the Groups 12, 13, or 14 elements. Some non-limiting, specific examples of materials for anode layer 110 include indium-tin-oxide ("ITO"), aluminum-tin-oxide, gold, silver, copper, and nickel. The anode may also comprise an organic material such as polyaniline.

The anode layer 110 may be formed by a chemical or physical vapor deposition process or spin-cast process. Chemical vapor deposition may be performed as a plasma-enhanced chemical vapor deposition ("PECVD") or metal organic chemical vapor deposition ("MOCVD"). Physical vapor deposition can include all forms of sputtering, including ion beam sputtering, as well as e-beam evaporation and resistance evaporation. Specific forms of physical vapor deposition include rf magnetron sputtering and inductively-coupled plasma physical vapor deposition ("IMP-PVD"). These deposition techniques are well known within the semiconductor fabrication arts.

Usually, the anode layer 110 is patterned during a lithographic operation. The pattern may vary as desired. The layers can be formed in a pattern by, for example, positioning a patterned mask or resist on the first flexible composite barrier structure prior to applying the first electrical contact layer material. Alternatively, the layers can be applied as an overall layer (also called blanket deposit) and subsequently patterned using, for example, a patterned resist layer and wet chemical or dry etching techniques. Other processes for patterning that are well known in the art can also be used. When the electronic devices are located within an array, the anode layer 110 typically is formed into substantially parallel strips having lengths that extend in substantially the same direction.

The buffer layer 120 is usually cast onto substrates using a variety of techniques well-known to those skilled in the art. Typical casting techniques include, for example, solution casting, drop casting, curtain casting, spin-coating, screen printing, inkjet printing, and the like. Alternatively, the buffer layer can be patterned using a number of such processes, such as ink jet printing.

The electroluminescent (EL) layer 130 may typically be a conjugated polymer, such as poly(paraphenylenevinylene) or polyfluorene. The particular material chosen may depend on the specific application, potentials used during operation, or other factors. The EL layer 130 containing the electroluminescent organic material can be applied from solutions by any conventional technique, including spin-coating, casting, and printing. The EL organic materials can be applied directly by vapor deposition processes, depending upon the nature of the materials. In another embodiment, an EL polymer precursor can be applied and then converted to the polymer, typically by heat or other source of external energy (e.g., visible light or UV radiation).

Optional layer 140 can function both to facilitate electron injection/transport, and can also serve as a confinement layer to prevent quenching reactions at layer interfaces. More specifically, layer 140 may promote electron mobility and reduce the likelihood of a quenching reaction if layers 130 and 150 would otherwise be in direct contact. Examples of materials for optional layer 140 include metal-chelated oxinoid compounds (e.g., $Alq_3$ or the like); phenanthroline-based compounds (e.g., 2,9-dimethyl-4,7-diphenyl-1,10-phenanthroline ("DDPA"), 4,7-diphenyl-1,10-phenanthroline ("DPA"), or the like); azole compounds (e.g., 2-(4-biphenylyl)-5-(4-t-butylphenyl)-1,3,4-oxadiazole ("PBD" or the like), 3-(4-biphenylyl)-4-phenyl-5-(4-t-butylphenyl)-1,2,4-triazole ("TAZ" or the like); other similar compounds; or any one or more combinations thereof. Alternatively, optional layer 140 may be inorganic and comprise BaO, LiF, $Li_2O$, or the like.

The cathode layer 150 is an electrode that is particularly efficient for injecting electrons or negative charge carriers. The cathode layer 150 can be any metal or nonmetal having a lower work function than the first electrical contact layer (in this case, the anode layer 110). As used herein, the term "lower work function" is intended to mean a material having a work function no greater than about 4.4 eV. As used herein, "higher work function" is intended to mean a material having a work function of at least approximately 4.4 eV.

Materials for the cathode layer can be selected from alkali metals of Group 1 (e.g., Li, Na, K, Rb, Cs,), the Group 2 metals (e.g., Mg, Ca, Ba, or the like), the Group 12 metals, the lanthanides (e.g., Ce, Sm, Eu, or the like), and the actinides (e.g., Th, U, or the like). Materials such as aluminum, indium, yttrium, and combinations thereof, may also be used. Specific non-limiting examples of materials for the cathode layer 150 include barium, lithium, cerium, cesium, europium, rubidium, yttrium, magnesium, and samarium.

The cathode layer 150 is usually formed by a chemical or physical vapor deposition process. In general, the cathode layer will be patterned, as discussed above in reference to the anode layer 110. If the device lies within an array, the cathode layer 150 may be patterned into substantially parallel strips, where the lengths of the cathode layer strips extend in substantially the same direction and substantially perpendicular to the lengths of the anode layer strips. Electronic elements called pixels are formed at the cross points (where an anode layer strip intersects a cathode layer strip when the array is seen from a plan or top view).

In other embodiments, additional layer(s) may be present within organic electronic devices. For example, a layer (not shown) between the buffer layer 120 and the EL layer 130 may facilitate positive charge transport, band-gap matching of the layers, function as a protective layer, or the like. Similarly, additional layers (not shown) between the EL layer 130 and the cathode layer 150 may facilitate negative charge transport, band-gap matching between the layers, function as a protective layer, or the like. Layers that are known in the art can be used. In addition, any of the above-described layers can be made of two or more layers. Alternatively, some or all of inorganic anode layer 110, the buffer layer 120, the EL layer 130, and cathode layer 150, may be surface treated to increase charge carrier transport efficiency. The choice of materials for each of the component layers may be determined by balancing the goals of providing a device with high device efficiency with the cost of manufacturing, manufacturing complexities, or potentially other factors.

The different layers may have any suitable thickness. Inorganic anode layer 110 is usually no greater than approximately 500 nm, for example, approximately 10–200 nm; buffer layer 120, is usually no greater than approximately 250 nm, for example, approximately 50–200 nm; EL layer 130, is usually no greater than approximately 1000 nm, for example, approximately 50–80 nm; optional layer 140 is usually no greater than approximately 100 nm, for example, approximately 20–80 nm; and cathode layer 150 is usually no greater than approximately 100 nm, for example, approximately 1–50 nm. If the anode layer 110 or the cathode layer 150 needs to transmit at least some light, the thickness of such layer may not exceed approximately 100 nm.

Depending upon the application of the electronic device, the EL layer 130 can be a light-emitting layer that is activated by signal (such as in a light-emitting diode) or a layer of material that responds to radiant energy and generates a signal with or without an applied potential (such as detectors or voltaic cells). Examples of electronic devices that may respond to radiant energy are selected from photoconductive cells, photoresistors, photoswitches, phototransistors, and phototubes, and photovoltaic cells. After reading this specification, skilled artisans will be capable of selecting material(s) that are suitable for their particular applications. The light-emitting materials may be dispersed in a matrix of another material, with or without additives, but preferably form a layer alone. The EL layer 130 generally has a thickness in the range of approximately 50–500 nm.

In organic light emitting diodes (OLEDs), electrons and holes, injected from the cathode 150 and anode 110 layers, respectively, into the EL layer 130, form negative and positively charged polarons in the polymer. These polarons migrate under the influence of the applied electric field, forming a polaron exciton with an oppositely charged species and subsequently undergoing radiative recombination. A sufficient potential difference between the anode and cathode, usually less than approximately 12 volts, and in many instances no greater than approximately 5 volts, may be applied to the device. The actual potential difference may depend on the use of the device in a larger electronic component. In many embodiments, the anode layer 110 is biased to a positive voltage and the cathode layer 150 is at substantially ground potential or zero volts during the operation of the electronic device. A battery or other power source(s) may be electrically connected to the electronic device as part of a circuit but is not illustrated in FIG. 1.

In a further embodiment, there are provided methods for improving efficiency of an electroluminescent device having at least one active layer comprising polyfluorene, comprising incorporating into the polyfluorene a plurality of multi-functional monomeric units that form branching points in the polyfluorene, thereby improving efficiency of the electroluminescent device. In one embodiment, the multi-functional monomeric unit is a tertiary amine. In another embodiment, tertiary amine is an aromatic tertiary amine, such as, tris-(4-bromophenyl)amine.

The invention will now be described in greater detail by reference to the following non-limiting examples.

EXAMPLES

Example 1

This example illustrates the prepration of an invention polymer, Polymer 1, having the structure below.

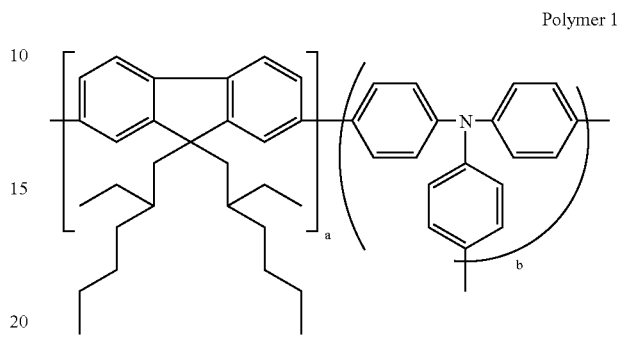

Polymer 1

Under inert conditions, DMF (6 ml) was added to a Sohlenck tube equipped with a stirring bar and containing bis(1,5-cyclooctadiene)nickel(0) (2.04 g, 7.41 mmol), 2,2'-bipyridyl (1.16 g, 7.41 mmol), and 1,5-cyclooctadiene (0.80 g, 7.41 mmol). The ensuing deep blue/purple solution was stirred at 60° C. for 30 minutes, and then a solution of a first monomer, 2,7-dibromo-9,9-bis-(2-ethyl-hexyl)-9H-fluorene (2.00 g, 3.65 mmol) and a second monomer, tris(4-bromophenyl)amine (10.0 mg, 0.02 mmol) in toluene (25 ml) was added via syringe. The reaction mixture was then stirred at 75° C. for 24 h. The mixture was cooled to room temperature and precipitated into a solution of methanol (100 ml). acetone (100 ml) and concentrated hydrochloric acid (5 ml). After stirring for 2 hours, the mixture was filtered. The solid residue was then dissolved in chloroform, and again precipitated into a solution of methanol (100 ml), acetone (100 ml) and concentrated hydrochloric acid (5 ml). After stirring for 1 hour, the mixture was filtered. The solid was again dissolved in chloroform and precipitated in pure methanol. Finally the residue was successively washed with methanol, water and methanol and dried in vacuo. This polymer is referred to as Polymer 1.

The surface of a 1 micron square section of a film of Polymer 1 was examined with an Atomic Force Microscope (AFM). The surface morphology was dense and very smooth.

Comparative Example A

Comparative Polymer A, having the structure below without any branching, was prepared using the procedure of Example 1.

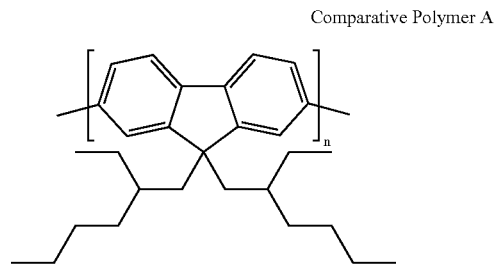

Comparative Polymer A

The surface of a 1 micron square section of a film of Comparative Polymer A was examined by AFM. The surface morphology was much more rough and less dense than that of Polymer 1.

Example 2

This example illustrates the performance of the invention polymer in a device.

Light-emitting diodes were fabricated using Polymer 1 and Comparative Polymer A as electroluminescent polymers (ELP). The devices had the architecture:

ITO/PEDOT/ELP/Ba/Al

On top of ITO, a thin layer (nominally 200 nm) of PEDOT was spin-coated and used as the buffer and the hole-injecting layer. Thickness of the EL polymer layer was approximately 60–80 nm. The thickness was measured using a surface profiler (Alpha-Step 500™ Surface Profiler, Tencor Instruments available from KLA-Tencor Corporation of San Jose, Calif.). The metal cathode film was fabricated on top of the EL polymer layer using vacuum vapor deposition at pressures below $1\times10^{-6}$ Torr. The cathode area defined the active area of the devices. The deposition speed and the thickness of the cathode layer were monitored with an STM-100 thickness/rate meter (Sycon Instruments, Inc. of Syracuse, N.Y.). Immediately after deposition of barium, 500 nm of aluminum capping layer was deposited on the top of barium metal layer. Finally, the device was packaged using a simple glass cover fixed with an ultraviolet (UV) curing epoxy resin. The results for each of the devices is given in Table 1 below.

TABLE 1

|  | V | mA/cm$^2$ | Cd/m$^2$ | cd/A | QE (%) |
|---|---|---|---|---|---|
| Comparative Polymer A | 7.5 | 33.3 | 17 | 0.05 | 0.07 |
| Polymer 1 | 7.6 | 33.3 | 127 | 0.38 | 0.49 |

While the invention has been described in detail with reference to certain preferred embodiments thereof, it will be understood that modifications and variations are within the spirit and scope of that which is described and claimed.

What is claimed is:

1. A polymeric composition comprising:
   a first plurality of first monomeric units comprising an aromatic group with at least one substituent selected from alkyl, heteroalkyl, alkenyl, heteroalkenyl, alkynyl, heteroalkynyl, aryl, arylalkyl, heteroaryl, heteroarylalkyl, and amino, and
   a second plurality of second multi-functional monomeric units, wherein each multi-functional monomeric unit is capable of forming a branching point in the polymeric composition, wherein the second monomeric unit is selected from triaryl amines.

2. The polymeric composition of claim 1, wherein the aromatic group is selected from fluorene, spirofluorene, phenyl, biphenyl, bridged biphenyl, naphthalene, and anthracene.

3. The polymeric composition of claim 2, wherein the aromatic group is a dialkylfluorene.

4. A polymeric composition comprising:
   a first plurality of first monomeric units comprising an aromatic group with at least one substituent selected from alkyl, heteroalkyl, alkenyl, heteroalkenyl, alkynyl, heteroalkynyl, aryl, arylalkyl, heteroaryl, heteroarylalkyl, and amino, and
   a second plurality of second multi-functional monomeric units, wherein each multi-functional monomeric unit is capable of forming a branching point in the polymeric composition, wherein the second monomeric unit is selected from:

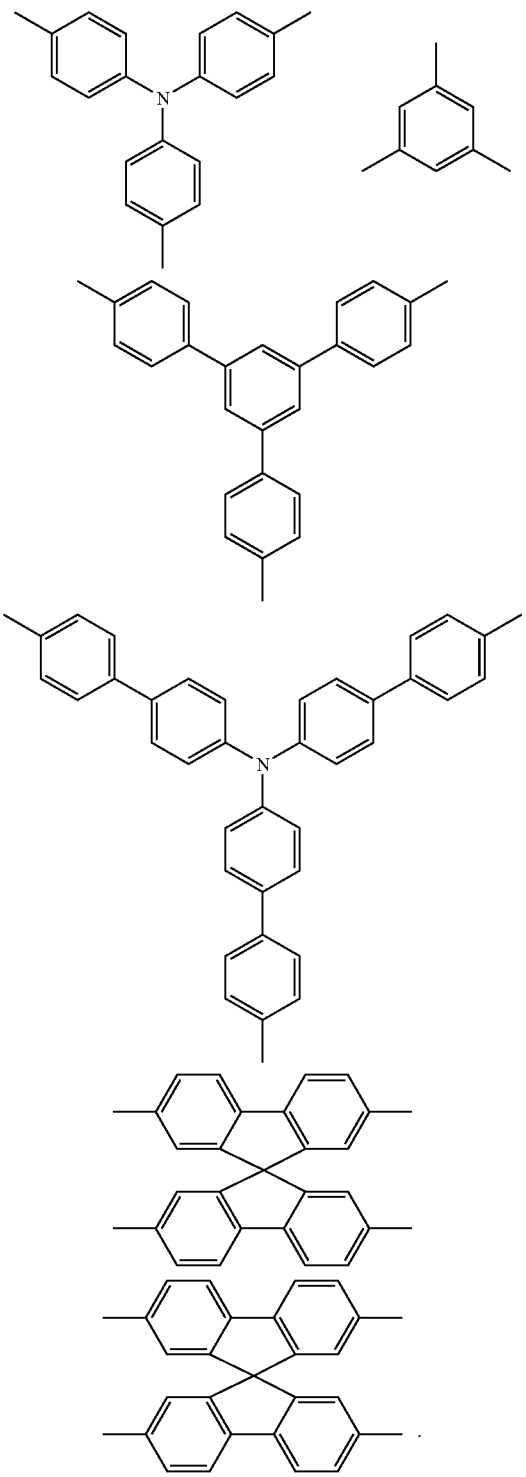

5. The polymeric composition of claim 1, wherein said multi-functional monomeric unit comprises from 0.1 mol % to about 5 mol % of the total polymeric composition.

6. An organic light emitting diode (OLED) comprising an active layer comprising the polymeric composition of claim 1.

7. An electroluminescent device comprising an active layer comprising the polymeric composition of claim 1.

8. The polymeric composition of claim 4, wherein the aromatic group is selected from fluorene, spirofluorene, phenyl, biphenyl, bridged biphenyl, naphthalene, and anthracene.

9. The polymeric composition of claim 8, wherein the aromatic group is a dialkylfluorene.

10. The polymeric composition of claim 4, wherein said multi-functional monomeric unit comprises from 0.1 mol % to about 5 mol % of the total polymeric composition.

11. An organic light emitting diode (OLED) comprising an active layer comprising the polymeric composition of claim 4.

12. An electroluminescent device comprising an active layer comprising the polymeric composition of claim 4.

* * * * *